United States Patent
Lai

(10) Patent No.: US 7,623,041 B2
(45) Date of Patent: Nov. 24, 2009

(54) PORTABLE PARTIAL DISCHARGE DETECTION APPARATUS AND METHOD THEREOF

(75) Inventor: Chia-Shun Lai, Chutung Township, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 302 days.

(21) Appl. No.: 11/790,526

(22) Filed: Apr. 26, 2007

(65) Prior Publication Data
US 2008/0157988 A1    Jul. 3, 2008

(30) Foreign Application Priority Data
Dec. 27, 2006    (TW) ............... 95149270 A

(51) Int. Cl.
  *G02B 21/00*   (2006.01)
  *G01R 31/02*   (2006.01)
  *H04B 3/46*    (2006.01)
  *H01H 31/12*   (2006.01)

(52) U.S. Cl. .............. 340/635; 340/647; 324/541; 324/544; 324/551

(58) Field of Classification Search ........... 340/635, 340/647; 324/522, 547, 535, 536, 541–544, 324/555, 556, 551
See application file for complete search history.

(56) References Cited

U.S. PATENT DOCUMENTS

| | | | |
|---|---|---|---|
| 5,200,737 A * | 4/1993 | Konishi et al. ............... 340/644 |
| 5,530,366 A * | 6/1996 | Nasrallah ..................... 324/547 |
| 5,804,972 A | 9/1998 | de Kock et al. |
| 5,973,500 A * | 10/1999 | Moreau et al. ............... 324/551 |
| 6,172,862 B1 * | 1/2001 | Jonnatti et al. ................ 361/78 |
| 6,297,642 B1 * | 10/2001 | Shibahara et al. ........... 324/536 |
| 6,809,653 B1 * | 10/2004 | Mann et al. ............. 340/870.28 |
| 6,930,491 B2 | 8/2005 | Gregory et al. |
| 6,984,902 B1 | 1/2006 | Huang et al. |
| 7,105,982 B1 | 9/2006 | Hagood, IV et al. |
| 7,167,007 B2 * | 1/2007 | Coffeen et al. ............... 324/522 |
| 2006/0055549 A1 * | 3/2006 | Fischer et al. ............... 340/635 |

FOREIGN PATENT DOCUMENTS

| TW | 055997 | 1/1984 |
|---|---|---|
| TW | 00168771 | 9/1991 |
| TW | 00182034 | 4/1992 |
| TW | 00332944 | 6/1998 |
| TW | 200522470 | 7/2005 |
| TW | M288465 | 3/2006 |

\* cited by examiner

*Primary Examiner*—Jennifer Mehmood
(74) *Attorney, Agent, or Firm*—Bacon & Thomas, PLLC

(57) ABSTRACT

A portable partial discharge detection apparatus and method thereof are provided. The portable partial discharge detection apparatus includes a detection unit, a control unit and an alarm unit. The detection unit is for detecting a signal generated by an apparatus under tested due to insulation degradation. The control unit is for diagnosing whether the signal is partially discharging and outputting a diagnosis result of partial discharge according to the number of partially discharging per unit of time. The alarm unit is for automatically notifying the diagnosis result of partial discharge.

19 Claims, 5 Drawing Sheets

10 Portable partial discharge detection apparatus

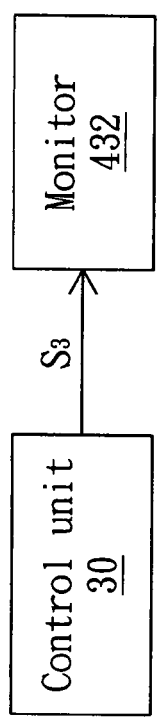
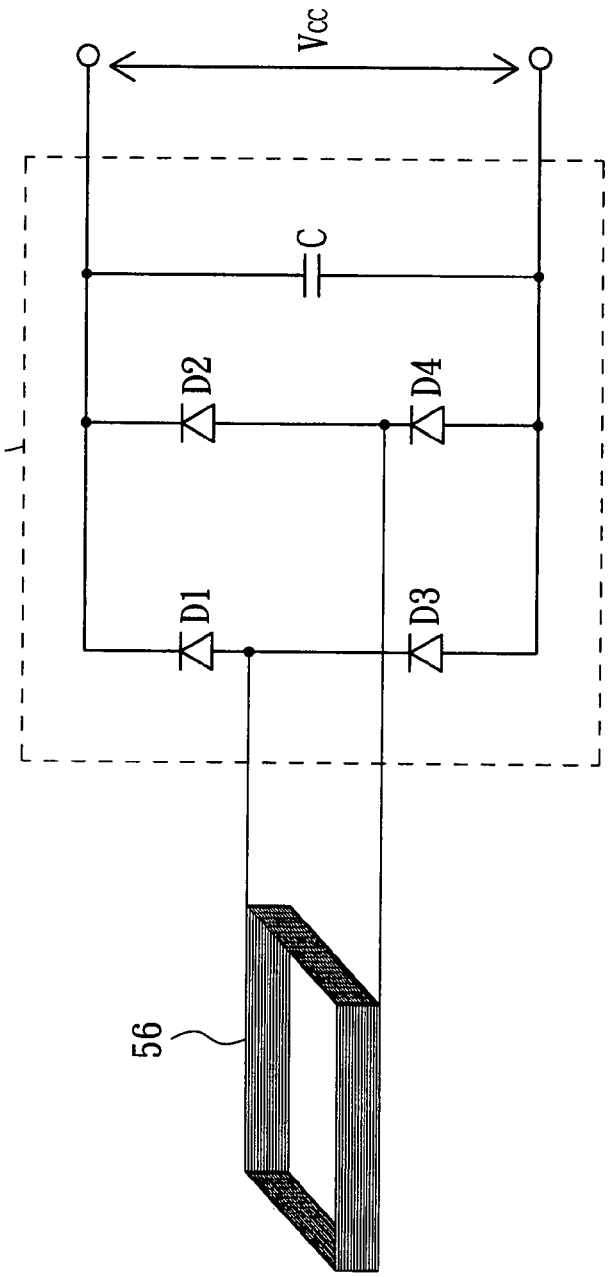
FIG. 6
FIG. 7

PORTABLE PARTIAL DISCHARGE DETECTION APPARATUS AND METHOD THEREOF

This application claims the benefit of Taiwan application Serial No. 95149270, filed Dec. 27, 2006, the subject matter of which is incorporated herein by reference.

BACKGROUND OF THE INVENTION

1. Field of the Invention

The invention relates in general to a portable partial discharge detection apparatus and method thereof, and more particularly to a portable partial discharge detection apparatus, which can automatically notify a detection result, and method thereof.

2. Description of the Related Art

Corona discharge is a kind of partial discharge that means a phenomenon of air discharge on a conductor surface. When the potential gradient of a void in conductor exceeds an air insulation intensity (about 1 KV/cm), the air will be ionized to generate the phenomenon of corona discharge. The corona discharge issue occurs especially in high-voltage electrical equipment of poor insulation material, design, manufacturing, fabrication and maintenance.

When the corona discharge happens, the following drawbacks will be easily created on the electrical equipment:

1. The corona discharge causes an ion bombardment effect and rapidly damages insulation material of the electrical equipment.

2. The corona discharge easily generates chemical materials such as ozone, nitrogen oxides and nitric acid, which will speed up degradation of insulation material.

3. The corona discharge will generate a radio interference voltage (RIV) to be measured.

4. The corona discharge easily causes a flashover issue to damage the equipment.

Referring to FIG. 1, a waveform diagram of a conventional corona discharge measurement is shown. A conventional method of measuring the corona discharge includes the following steps. First, before corona discharge detection, inspector manually performs complicated wiring connection on a lot of large expensive measuring instruments. Following that, perform a complicated calibration operation on a standard device. Next, measure the partial discharge waveforms of the electrical under tested (as shown in FIG. 1). Finally, professional staff with rich experience judges the serious extent of corona discharge according to the waveforms.

The conventional corona discharge detection method has the following drawbacks:

1. The method has to use a great amount of large expensive measuring instruments.

2. The inspector has to perform a complicated calibration process on the device.

3. The conventional measuring instruments are difficult to be set up, and the possibility of electrical shock is high.

4. The diagnostic result of corona discharge cannot be obtained immediately.

5. The inspection plan of partial discharge is reduced due to high detection fee.

6. The electric power source is difficult to obtain as detecting the corona discharge outdoors.

SUMMARY OF THE INVENTION

The invention is directed to a portable partial discharge detection apparatus that can automatically notify the detection result, and a method thereof. By calculating the number of partially discharging per unit of time, the partial discharge of electrical equipment status can be notified automatically. The portable partial discharge detection apparatus and method thereof can not only automatically notify the detection result and have at least the following advantages:

1. The portable partial discharge detection apparatus is a single device and has small size.

2. The portable partial discharge detection apparatus has lower manufacturing cost as compared to that of a conventional measuring instrument.

3. The complicated wiring connection operation is not needed.

4. The possibility of electric shock for partial discharge inspection can be reduced.

5. The complicated calibration procedures are not needed.

6. The cost of partial discharge inspection can be greatly reduced.

7. The operational power can be automatically supplied to the portable partial discharge detection apparatus.

According to a first aspect of the present invention, a portable partial discharge detection apparatus is provided. The apparatus comprises a detection unit, a control unit and an alarm unit. The detection unit is for detecting a signal generated by an apparatus under tested due to insulation degradation. The control unit is for distinguishing whether the signal is partially discharging and outputting diagnosis result of partial discharge according to the number of partially discharging per unit of time. The alarm unit is for automatically notifying the diagnosis result of partial discharge.

According to a second aspect of the present invention, a method of detecting partial discharge applied to a portable partial discharge detection apparatus is provided. The method comprises (a) detecting a signal generated by an apparatus under tested due to insulation degradation; (b) diagnosing whether the signal is partially discharging and outputting a diagnosis result of partial discharge according to the number of partially discharging per unit of time; and (c) automatically notifying the diagnosis result of partial discharge.

The invention will become apparent from the following detailed description of the preferred but non-limiting embodiments. The following description is made with reference to the accompanying drawings.

BRIEF DESCRIPTION OF THE DRAWINGS

FIG. 6 is a schematic diagram of a third kind of alarm unit.

FIG. 7 is a schematic diagram of a self-power generation unit.

DETAILED DESCRIPTION OF THE INVENTION

When the insulation degrading extent of an apparatus under tested is getting more serious, the number of partially discharging per unit of time will be increased. Therefore, the following embodiment discloses a portable partial discharge detection apparatus that can automatically notify a diagnosis result of partial discharge by determining the number of partially discharging per unit of time. Besides, the following embodiment further discloses a self-power generation unit. When the portable partial discharge detection apparatus approaches the apparatus under tested, the self-power generation unit can convert the electromagnetic energy generated by the apparatus under tested into an operational power for the portable partial discharge detection apparatus.

Figure 1:
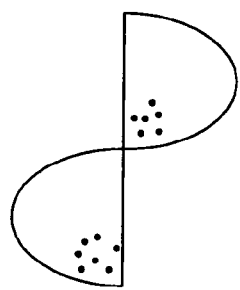
FIG. 1 is a waveform diagram of a conventional corona discharge measurement.
Figure 2:
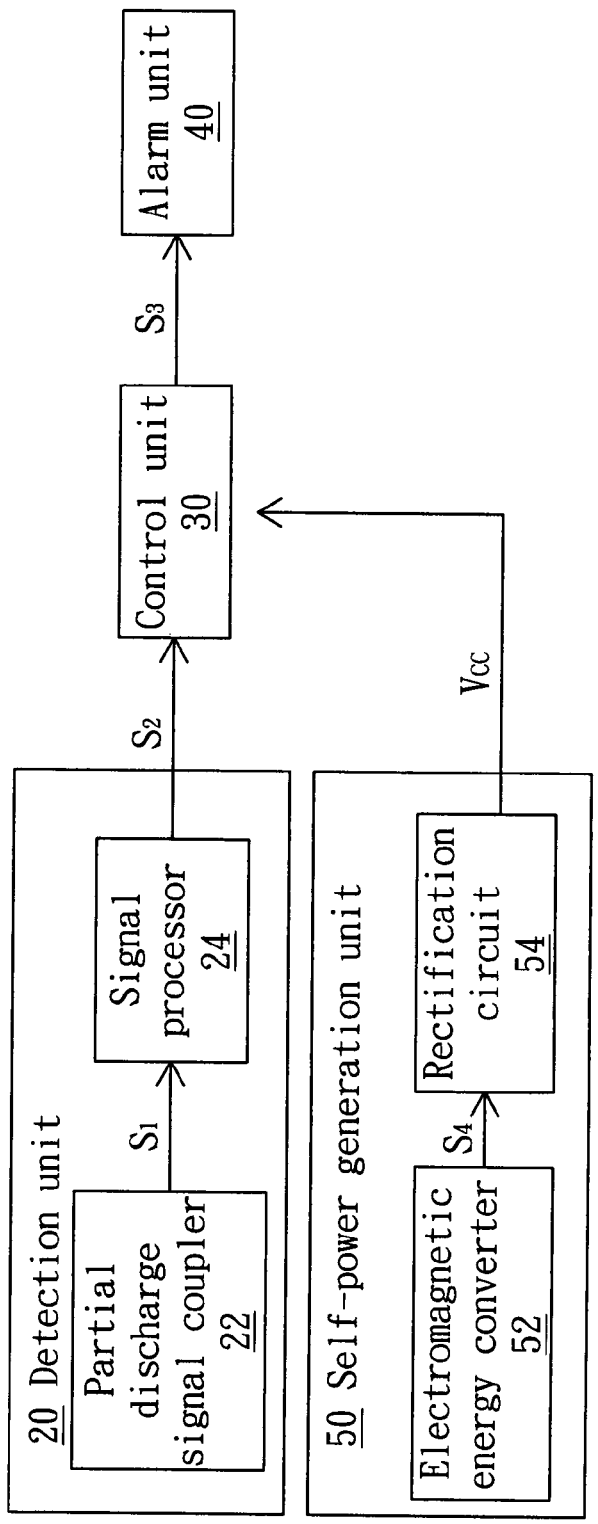
FIG. 2 is a block diagram of a portable partial discharge detection apparatus according to a preferred embodiment of the invention.

Referring to FIG. 2, a block diagram of a portable partial discharge detection apparatus according to a preferred embodiment of the invention is shown. A portable partial discharge detection apparatus 10 includes a detection unit 20, a control unit 30, an alarm unit 40 and a self-power generation unit 50.

The self-power generation unit 50 is for converting electromagnetic energy into an operational power Vcc for the portable partial discharge detection apparatus 10 and the detection unit 20 is for detecting a partial discharge signal generated by an apparatus under tested due to insulation degradation.

The control unit 30 determines whether the signal generated by the apparatus under tested due to insulation degradation is partially discharging according to a waveform of the signal. The control unit 30 also outputs a diagnosis result S3 of partial discharge to the alarm unit 40 to automatically notify the detection result of partial discharge of the apparatus under tested 10 according to the number of partially discharging per unit of time without need of diagnosis by professional staff.

The detection unit 20 further includes a partial discharge signal coupler 22 and signal processor 24. The partial discharge signal coupler 22 is for sensing the partial discharge signal generated by the apparatus under tested due to insulation degradation and accordingly outputting a sensing signal S1. The signal processor 24 is for outputting a digital signal S2 to the control unit 30 according to the sensing signal S1.

The control unit 30 receives the digital signal S2, accordingly determines whether the signal generated by the apparatus under tested due to insulation degradation is partially discharging, and calculates the number of partially discharging per unit of time. The control unit 30 outputs the corresponding detection result S3 of partial discharge to the alarm unit 40 according to the number of partially discharging. The alarm unit 40 can automatically notify the diagnosis result S3 of the apparatus under tested without need of diagnosis by professional staff.

The self-power generation unit 50 further includes an electromagnetic energy converter 52 and rectification circuit 54. The electromagnetic energy converter 52 is for converting the electromagnetic energy generated by the apparatus under tested into an electric power S4 and outputting the electric power S4 to the rectification circuit 54. The rectification circuit 54 rectifies the electric power S4 and accordingly generates the operational power Vcc for the portable partial discharge detection apparatus 10.

Compared to the expensive measuring instruments, the portable partial discharge detection apparatus 10 can not only reduce the manufacturing cost but also reduce its size to increase the convenience in usage.

Besides, when the portable partial discharge detection apparatus 10 approaches the apparatus under tested, the alarm unit 40 can automatically display and notify the detection result of partial discharge. Therefore, the embodiment needs no complicated wiring connection process and can reduce the danger of approaching a high voltage as detecting partial discharge. The user can directly perform parameter settings on the portable partial discharge detection apparatus 10 to prevent the complicated calibration operation.

Figure 3:
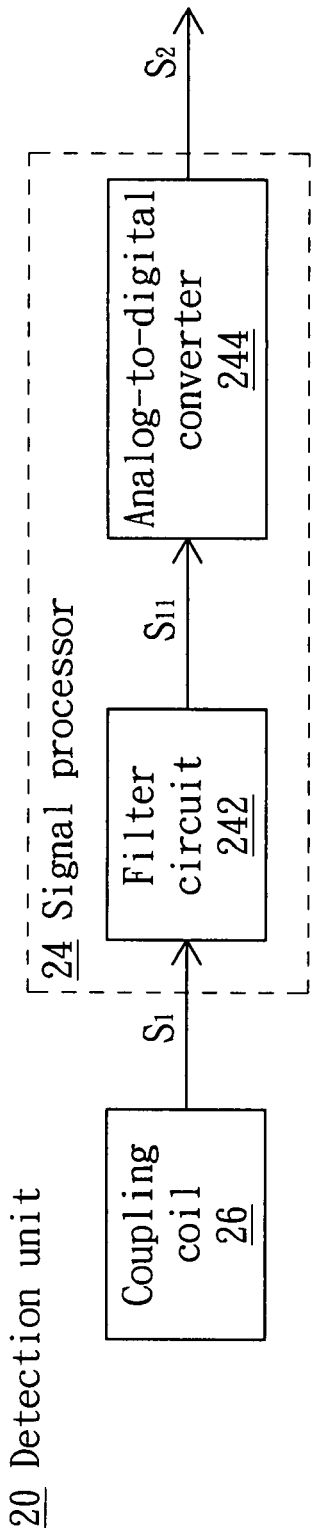
FIG. 3 is a schematic diagram of a detection unit.

Referring to FIG. 3, a schematic diagram of a detection unit is shown. The partial discharge signal coupler 22 of the detection unit 20 is a coupling coil 26 for instance and the signal processor 24 further includes a filter circuit 242 and an analog-to-digital converter 244. The coupling coil 26 is for sensing the partial discharge and accordingly outputting the sensing signal S1 to the filter circuit 242. The filter circuit 242 filters the noise component of the sensing signal S1 and accordingly outputs an analog signal S11 to the analog-to-digital converter 244. The analog-to-digital converter 244 converts the analog signal S11 into the digital signal S2 and outputs the digital signal S2 to the control unit 30.

The control unit 30 is a single chip processor for instance and stores a diagnostic program. The diagnostic program sets a number of numeric ranges beforehand. Each numeric range represents a measured number of partially discharging per unit of time. For example, the first numeric range represents the number 0~100 of partially discharging per unit of time; the second numeric range represents the number 100~200 of partially discharging per unit of time; the third numeric range represents the number 200~300 of partially discharging per unit of time. When the number of partial discharge is located in a certain numeric range, the control unit 30 outputs the corresponding diagnosis result S3 of partial discharge to the alarm unit 40. The user can obtain the diagnosis result S3 of partial discharge of the apparatus under tested from the alarm unit 40.

The alarm unit 40, such as a light emitting device, voice player or monitor, is for automatically notifying the partial-discharge diagnosis result S3 of the apparatus under tested.

Figure 4:
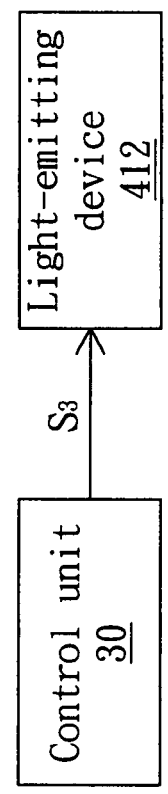
FIG. 4 is a schematic diagram of a first kind of alarm unit.

Referring to FIG. 4, a schematic diagram of a first kind of alarm unit is shown. The alarm unit 40 is a light-emitting device 412 for instance. When the number of partial discharge is located in a certain numeric range, the control unit 30 outputs the corresponding diagnosis result S3 of partial discharge to the light-emitting device 412. The light-emitting device 412, such as a light emitting diode (LED), can denote various insulation degradation extents of the apparatus under tested by different flashing frequency. Besides, the light-emitting device 412 can also denote the insulation degradation extent of the apparatus under tested through its color.

Figure 5:
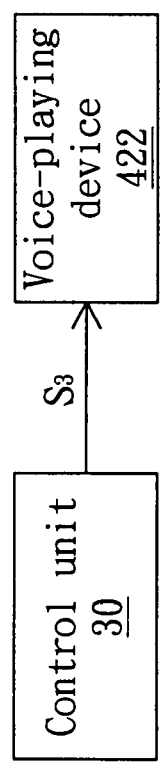
FIG. 5 is a schematic diagram of a second kind of alarm unit.

Referring to FIG. 5, a schematic diagram of a second kind of alarm unit is shown. The alarm unit 40 is a voice-playing device 422 for instance. When the frequency of partial discharge is located in a certain numeric region, the control unit 30 outputs the corresponding diagnosis result S3 of partial discharge to the voice-playing device 422. The voice-playing device 422 can denote various insulation degradation extents of the apparatus under tested by different alarm voice.

Referring to FIG. 6, a schematic diagram of a third kind of alarm unit is shown. The alarm unit 40 is a monitor 432 for instance. When the frequency of partial discharge is located in a certain numeric region, the control unit 30 outputs the corresponding detection result S3 of partial discharge to the monitor 432 to display the insulation degradation extents of the apparatus under tested.

Referring to FIG. 7, a schematic diagram of a self-power generation unit is shown. The apparatus under tested is usually high-voltage electrical equipment, and the self-power generation unit 50 can convert the electromagnetic energy into the required operational power Vcc for the portable partial discharge detection apparatus 10. The electromagnetic energy converter 52 of the self-power generation unit 50 is a sensing coil 56 for instance and the rectification circuit 54 includes a capacitor C and diodes D1~D4. The sensing coil 56 has a first end coupled to a positive end of the diode D1 and a negative end of the diode D3 and a second end coupled to a positive end of the diode D2 and a negative end of the diode D4. The negative ends of the diodes D1 and D2 are coupled to a first end of the capacitor C and the positive ends of the diodes D3 and D4 are coupled to the second end of the capacitor C.

When the sensing coil 56 approaches or is put around the power line of the apparatus under tested, the sensing coil 56 can convert the electromagnetic energy into the electric power S4 by a sensing way. The electric power S4 is rectified through the capacitor C and diodes D1~D4 and outputted as the operational power Vcc for the portable partial discharge detection apparatus 10.

As a result, when the portable partial discharge detection apparatus 10 detects the situation of partial discharge over the apparatus under tested, no extra power is needed. Besides, owing that the portable partial discharge detection apparatus 10 needs no extra power, it can be applied to monitor insulation degradation extent of the apparatus under tested in a long term and be convenient as used in places where electric power is difficult to obtain. Therefore, the breakdown issue can be prevented by earlier electrical equipment maintenance.

Figure 8:
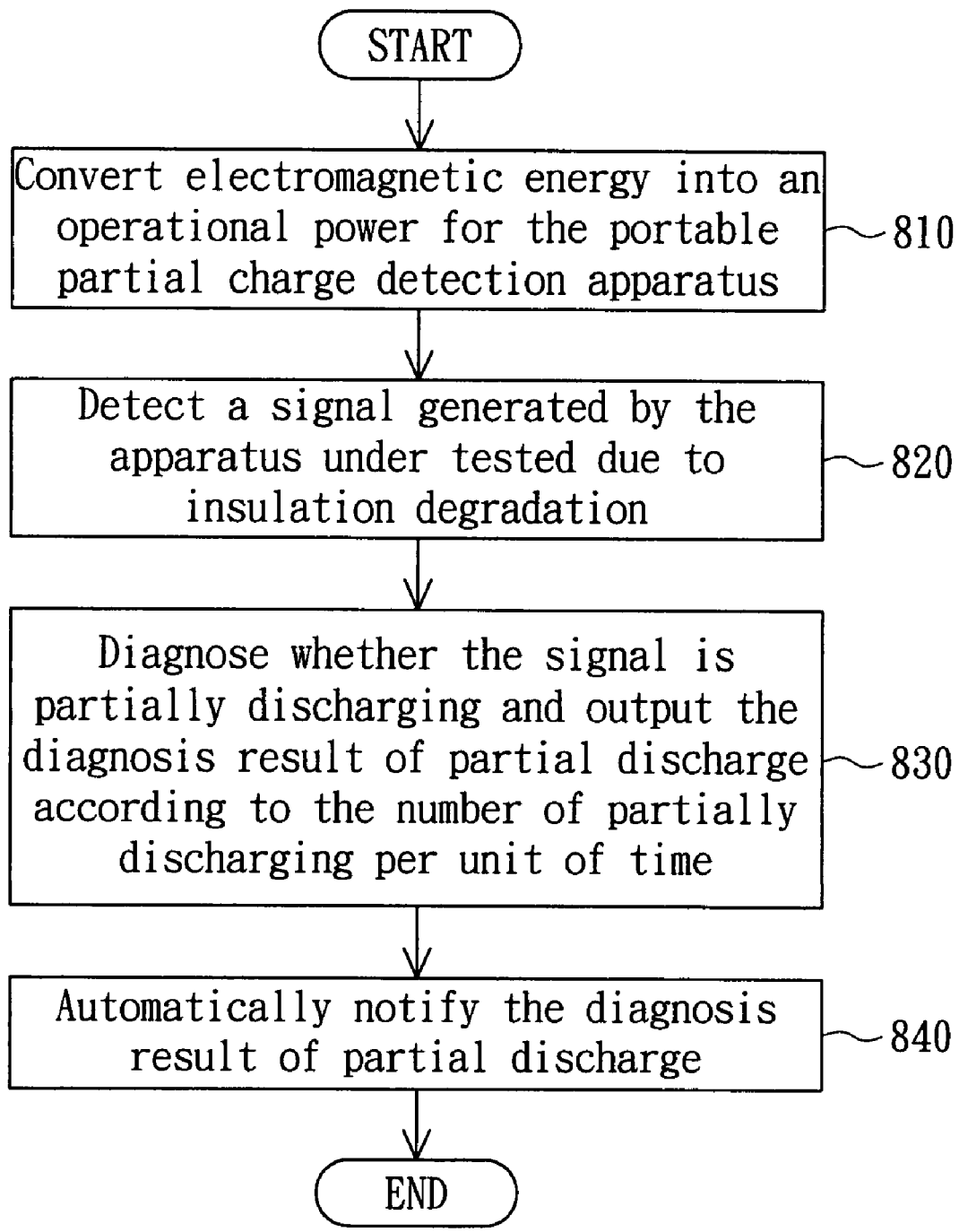
FIG. 8 is a flow chart of a partial discharge detection method according to a preferred embodiment of the invention.

Referring to FIG. 8, a flow chart of a partial discharge detection method according to a preferred embodiment of the invention is shown. The method is applied to the above portable partial discharge detection apparatus 10 and includes the following steps.

First, in step 810, the self-power generation apparatus 50 converts the electromagnetic energy generated by the apparatus under tested into the operational power Vcc for the portable partial discharge detection apparatus 10.

Following that, in step 820, the detection unit 20 detects a signal generated by the apparatus under tested due to insulation degradation.

Next, in step 830, the control unit 30 diagnoses whether the signal is partially discharging and outputs the diagnosis result S3 of partial discharge according to the number of partially discharging per unit of time.

Finally, in step 840, the alarm unit 40 automatically notifies the diagnosis result of partial discharge.

Figure 9:
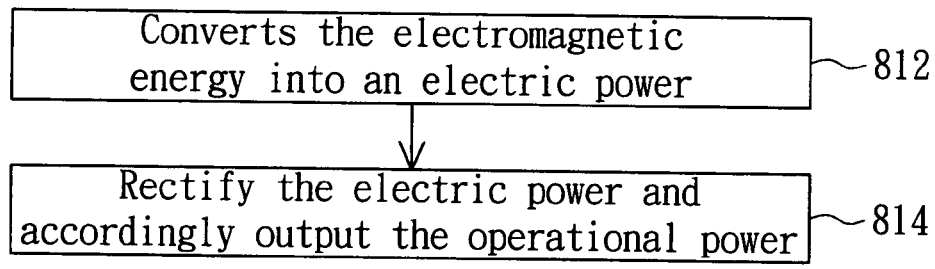
FIG. 9 is a detailed flow chart of the step 810.

Referring to FIG. 9, a detailed flow chart of the step 810 is shown. The step 810 further includes the following steps.

First, in step 812, the electromagnetic energy converter 52 converts the electromagnetic energy generated by the apparatus under tested into an electric power S4 and outputs the electric power S4 to the rectification circuit 54.

Following that, in step 814, the rectification circuit 54 rectifies the electric power S4 and accordingly outputs the operational power Vcc.

Figure 10:
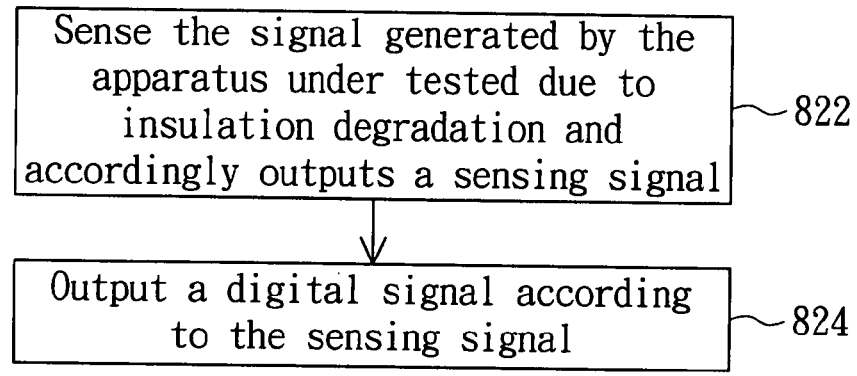
FIG. 10 is a detailed flow chart of the step 820.

Referring to FIG. 10, a detailed flow chart of the step 820 is shown. The step 820 further includes the following steps.

First, in step 822, the partial discharge signal coupler 22 senses the signal generated by the apparatus under tested due to insulation degradation and accordingly outputs the sensing signal S1 to the signal processor 24.

Following that, in step 824, the signal processor 24 outputs the digital signal S2 to the control unit 30 according to the sensing signal S1.

Figure 11:
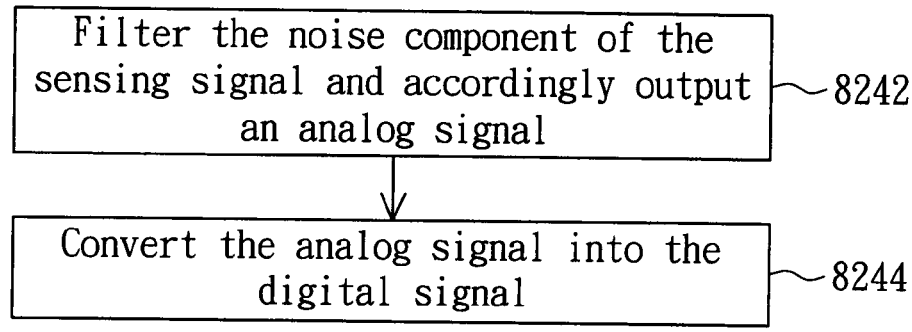
FIG. 11 is a detailed flow chart of the step 824.

Referring to FIG. 11, a detailed flow chart of the step 824 is shown. The step 824 further includes the following steps.

First, in step 8242, the filter circuit 242 filters the noise component of the sensing signal S1 and accordingly outputs the analog signal S11 to the analog-to-digital converter 244.

Following that, in step 8244, the analog-to-digital converter 244 converts the analog signal S11 into the digital signal S2 and outputs the digital signal S2 to the control unit 30.

The above portable partial discharge detection apparatus 10 and method thereof outputs the diagnosis result S3 of partial discharge to the alarm unit 40 according to the number of partially discharging in per unit of time. The alarm unit 40 can automatically notify the diagnosis result S3 of partial discharge. Moreover, when the portable partial discharge detection apparatus 10 approaches the apparatus under tested, the self-power generation unit 50 can convert the electromagnetic energy generated by the apparatus under tested into the operational power Vcc for the portable partial discharge detection apparatus 10.

The portable partial discharge detection apparatus and method thereof disclosed by the above embodiment of the invention have at least the following advantages:

1. The portable partial discharge detection apparatus is a single device and has small size.
2. The portable partial discharge detection apparatus has lower manufacturing cost as compared to that of a conventional measuring instrument.
3. The complicated wiring connection operation is not needed.
4. The possibility of electric shock for partial discharge inspection process can be reduced.
5. The complicated calibration procedures are not needed.
6. The diagnosis result of partial discharge can be obtained immediately.
7. The cost of partial discharge inspection can be greatly reduced.
8. The power generated by self-powered system can be automatically supplied to the portable partial discharge detection apparatus.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A portable partial discharge detection apparatus, comprising:

a detection unit, for detecting a signal generated by an apparatus to be tested due to insulation degradation and accordingly outputting a digital signal;

a control unit, for diagnosing whether the signal is partially discharging according to the digital signal, calculating a number of partially discharging when the signal is diagnosed to be partially discharging, and outputting a diagnosis result of partial discharge according to the number of partially discharging to be calculated per unit of time; and an alarm unit, for automatically notifying the diagnosis result of partial discharge.

2. The portable partial discharge detection apparatus according to claim 1, wherein the detection unit comprises:

a partial discharge signal coupler, for sensing the signal and accordingly outputting a sensing signal; and a signal processor, for outputting the digital signal to the control unit according to the sensing signal.

3. The portable partial discharge detection apparatus according to claim 2, wherein the partial discharge signal processor comprises:
 a filter circuit, for filtering a noise component of the sensing signal and accordingly outputting an analog signal; and
 an analog-to-digital converter, for converting the analog signal to the digital signal and outputting the digital signal to the control unit.

4. The portable partial discharge detection apparatus according to claim 2, wherein the partial discharge signal coupler is a coupling coil.

5. The portable partial discharge detection apparatus according to claim 1, further comprising a self-power generation unit for convening electromagnetic energy into an operational power for the portable partial discharge detection apparatus.

6. The portable partial discharge detection apparatus according to claim 5, wherein the self-power generation unit comprises:
 an electromagnetic energy converter, for converting the electromagnetic energy into an electric power; and
 a rectification circuit, for rectifying the electric power and accordingly outputting the operational power.

7. The portable partial discharge detection apparatus according to claim 6, wherein the electromagnetic energy converter is a sensing coil.

8. The portable partial discharge detection apparatus according to claim 6, wherein the rectification circuit comprises:
 first to fourth diodes, positive ends of the first diode and the second diode respectively coupled to negative ends of the third diode and the fourth diode; and
 a capacitor, has a first end coupled to negative ends of the first diode and the second diode and a second end coupled to positive ends of the third diode and the fourth diode.

9. The portable partial discharge detection apparatus according to claim 1, wherein the control unit is a single chip processor.

10. The portable partial discharge detection apparatus according to claim 1, wherein the control unit stores a determination program for setting a plurality of numeric regions beforehand, when the number of partially discharging in per unit of time is located in one of the numeric regions, the control unit outputs the corresponding detection result of partial discharge.

11. The portable partial discharge detection apparatus according to claim 1, wherein the control unit diagnoses whether the signal is partially discharging according to a waveform of the signal and accordingly calculates the number of partially discharging per unit of time.

12. The portable partial discharge detection apparatus according to claim 1, wherein the alarm unit is a light emitting device.

13. The portable partial discharge detection apparatus according to claim 1, wherein the alarm unit is a voice playing device.

14. The portable partial discharge detection apparatus according to claim 1, wherein the alarm unit is a monitor.

15. A method of detecting partial discharge, applied to a portable partial discharge detection apparatus, the method comprising:
 (a) detecting a signal generated by an apparatus to be tested due to insulation degradation;
 (b) diagnosing whether the signal is partially discharging and outputting a diagnosis result of partial discharge according to the number of partially discharging per unit of time;
 (c) automatically notifying the diagnosis result of partial discharge; and
 (d) converting an electromagnetic energy generated by the apparatus to be tested into an operational power for the portable partial discharge detection apparatus.

16. The method according to claim 15, wherein in the step (b), when the number of partially discharging per unit of time is located in a numeric region, the corresponding diagnosis result of partial discharge is outputted.

17. The method according to claim 15, wherein the step (a) comprises:
 (a1) sensing the signal and accordingly outputting a sensing signal; and
 (a2) outputting a digital signal according to the sensing signal.

18. The method according to claim 17, wherein the step (a2) comprises:
 (a2-1) filtering a noise component of the sensing signal and accordingly outputting an analog signal; and
 (a2-2) converting the analog signal into the digital signal.

19. The method according to claim 15 wherein the step (d) comprises:
 converting the electromagnetic energy into an electric power; and
 rectifying the electric power and accordingly outputting the operational power.

* * * * *